(12) United States Patent
Liao et al.

(10) Patent No.: US 12,701,994 B2
(45) Date of Patent: Aug. 4, 2026

(54) INTEGRATED CIRCUIT BUMPS INTEGRATED WITH TCOILS COUPLED BY WAY OF A METALLIZED VIA

(71) Applicant: QUALCOMM Incorporated, San Diego, CA (US)

(72) Inventors: Hongmei Liao, San Diego, CA (US); Xiaohua Kong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 683 days.

(21) Appl. No.: 18/081,589

(22) Filed: Dec. 14, 2022

(65) Prior Publication Data

US 2024/0203871 A1 Jun. 20, 2024

(51) Int. Cl.
*H01L 23/498* (2006.01)
*H01L 23/00* (2006.01)
(Continued)

(52) U.S. Cl.
CPC .......... *H10W 20/497* (2026.01); *H02H 9/046* (2013.01); *H10W 44/501* (2026.01);
(Continued)

(58) Field of Classification Search
CPC ............... H01L 23/5227; H01L 23/645; H01L 2924/1206; H01L 2924/19042; H01L 2924/30107; H01L 24/11; H01L 24/14–27; H01L 24/75; H01L 24/80; H01L 24/81; H01L 2224/0401; H01L 2224/73204; H01L 2924/14; H01L 2924/1423; H01L 21/823475; H01L 21/823871; H01L 21/76885; H01L 21/76895; H01L 21/76897; H01L 21/76804; H01L 21/76805; H01L 21/76816; H01L 21/76877; H01L 23/5226; H01L 23/5283; H01L 23/5286; H01L 23/528; H01L 23/481; H01L 23/535; H01L 23/5384; H01L 23/5386; H10D 89/911; H03H 2001/7008; H03H 7/422; H03H 7/425; H03H 7/46; H03H 7/48–482; H03H 9/0004; H10W 90/701; H10W 90/724; H10W 90/734; H10W 72/20; H10W 72/29; H10W 72/234; H10W 72/241;
(Continued)

(56) References Cited

U.S. PATENT DOCUMENTS 8,242,957 B2 8/2012 Rofougaran et al.
8,823,133 B2 9/2014 Jenkins et al.
(Continued)

FOREIGN PATENT DOCUMENTS

WO WO-2016004245 A1 * 1/2016 ......... H01F 17/0013

OTHER PUBLICATIONS

International Search Report and Written Opinion—PCT/US2023/080679—ISA/EPO—Apr. 11, 2024.
(Continued)

*Primary Examiner* — Wael M Fahmy
*Assistant Examiner* — Aneesa Riaz Baig
(74) *Attorney, Agent, or Firm* — Loza & Loza LLP

(57) ABSTRACT

An integrated circuit (IC) including an IC bump; and a Tcoil situated directly below the IC bump, wherein the Tcoil is electrically coupled to the IC bump by way of a metallized via hole.

28 Claims, 9 Drawing Sheets

(51) Int. Cl.

| | |
|---|---|
| *H02H 9/04* | (2006.01) |
| *H10D 1/60* | (2025.01) |
| *H10W 20/40* | (2026.01) |
| *H10W 40/00* | (2026.01) |
| *H10W 40/22* | (2026.01) |
| *H10W 44/00* | (2026.01) |
| *H10W 72/00* | (2026.01) |
| *H10W 72/20* | (2026.01) |
| *H10W 72/29* | (2026.01) |
| *H10W 72/30* | (2026.01) |
| *H10W 72/90* | (2026.01) |
| *H10W 74/15* | (2026.01) |
| *H10W 90/00* | (2026.01) |
| *H10W 99/00* | (2026.01) |

(52) U.S. Cl.

CPC ....... *H10W 44/601* (2026.01); *H10W 72/234* (2026.01); *H10W 72/241* (2026.01); *H10W 72/90* (2026.01); *H10W 90/00* (2026.01); *H10W 72/29* (2026.01); *H10W 90/724* (2026.01)

(58) Field of Classification Search

CPC ............. H10W 72/244; H10W 72/851; H10W 72/252; H10W 20/495497; H10W 44/501; H10W 44/601

See application file for complete search history.

(56) References Cited

U.S. PATENT DOCUMENTS

| | | | |
|---|---|---|---|
| 9,847,291 B2 * | 12/2017 | Leong | H01L 23/49827 |
| 10,483,343 B2 | 11/2019 | Chong et al. | |
| 10,797,658 B1 | 10/2020 | Raj | |
| 12,309,008 B1 * | 5/2025 | Kumar | H04L 25/0292 |
| 2006/0109023 A1 * | 5/2006 | Babcock | G01R 31/31924 |
| | | | 324/762.01 |
| 2006/0151851 A1 * | 7/2006 | Pillai | H01L 23/66 |
| | | | 257/536 |
| 2007/0279176 A1 * | 12/2007 | Chen | H10D 1/20 |
| | | | 336/200 |
| 2019/0089150 A1 | 3/2019 | Gharibdoust et al. | |
| 2020/0280295 A1 | 9/2020 | Fan et al. | |
| 2021/0099149 A1 * | 4/2021 | Lan | H03H 7/1741 |
| 2022/0093546 A1 * | 3/2022 | Elsherbini | H01L 23/49822 |
| 2022/0320021 A1 * | 10/2022 | Chamas | H03H 7/42 |
| 2024/0136279 A1 * | 4/2024 | Lim | H01L 23/5227 |

OTHER PUBLICATIONS

Wu Boping., et al., "Embedded Package Inductor for High Speed SerDes Design", 2016, 17th International Conference on Electronic Packaging Technology (ICEPT), IEEE, Aug. 16, 2016, pp. 994-995, XP032974353, the whole document.

* cited by examiner

500

500

INTEGRATED CIRCUIT BUMPS INTEGRATED WITH TCOILS COUPLED BY WAY OF A METALLIZED VIA

FIELD

Aspects of the present disclosure relate generally to integrated circuits, and in particular, to an integrated circuit (IC) bump (e.g., solder ball) integrated with a Tcoil for improved area efficiency and signal transmission/reception performance.

BACKGROUND

Data communication links, such as double data rate (DDR) and serializer/deserializer (SERDES) links, are used to communicate data signals between integrated circuits (ICs) and other components. Often, the data communication links include a set of parallel transmission lines, some of which may be differential transmission lines, pseudo-differential transmission lines, or single-ended transmission lines. Compensating the transmission lines for improved data rates and signal integrity is of interest.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an integrated circuit (IC). The IC includes an IC bump; and a Tcoil situated directly below the IC bump, wherein the Tcoil is electrically coupled to the IC bump by way of a metallized via hole.

Another aspect of the disclosure relates to a data communication system. The data communication system includes: a printed circuit board (PCB) including a set of transmission lines; and a first integrated circuit (IC) mounted on the PCB, wherein the first IC includes a first set of IC interface circuits, including: a first set of IC bumps electrically coupled to the set of transmission lines, respectively; and a first set of Tcoils, each Tcoil of the first set of Tcoils situated directly below a respective IC bump of the first set of IC bumps, wherein the first set of Tcoils are electrically coupled to the first set of IC bump by way of a first set of metallized via holes, respectively.

Another aspect of the disclosure relates to a wireless communication device. The wireless communication device including: at least one antenna; a transceiver coupled to the at least one antenna; and an integrated circuit (IC) including one or more signal processing cores, wherein the IC includes a set of IC interface circuits, including: a set of IC bumps electrically coupled to a set of transmission lines electrically coupling the IC to the transceiver, respectively; and a set of Tcoils, each Tcoil of the set of Tcoils situated directly below a respective IC bump of the set of IC bumps, wherein the set of Tcoils are electrically coupled to the set of IC bumps by way of a set of metallized via holes, respectively.

Another aspect of the disclosure relates to an integrated circuit (IC). The IC includes: a set of differential IC bump; and a set of differential Tcoils situated at least partially directly below the set of differential IC bumps, wherein the set of differential Tcoils is electrically coupled to the set of differential IC bumps by way of a set of metallized via hole, respectively.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
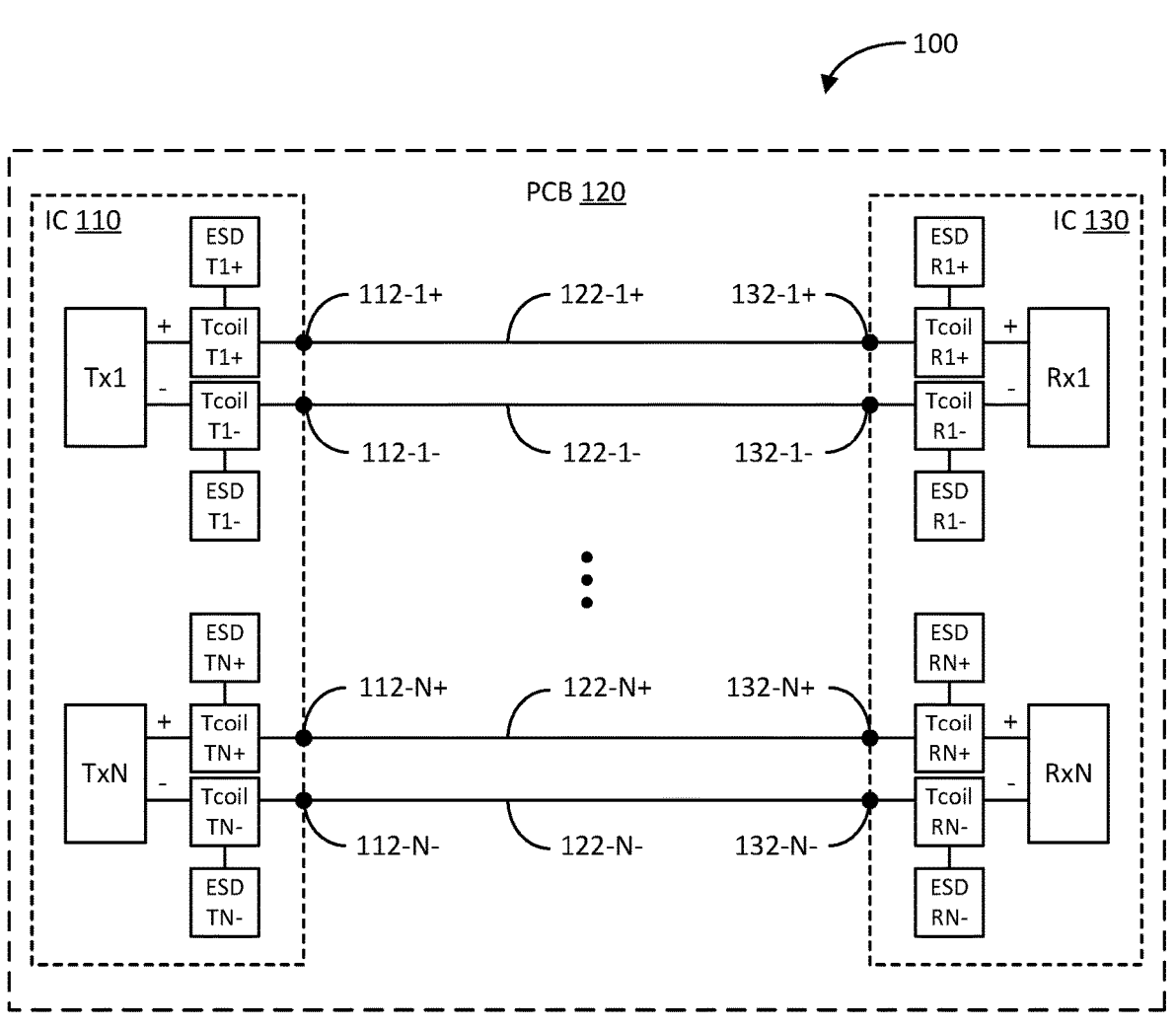
FIG. 1 illustrates a block diagram of an example data communication system in accordance with an aspect of the disclosure.

FIG. 1 illustrates a block diagram of an example data communication system 100 in accordance with an aspect of the disclosure. The data communication system 100 may be a serializer-deserializer (SerDes) communication link, or a double data rate (DDR) link. The data communication system 100 includes a first integrated circuit (IC) 110 and a second IC 130, both of which may be mounted on a printed circuit board (PCB) 120. The PCB 120 includes a set of differential transmission lines 122-1+/122-1− to 122-N+/122-N− data/clock signal coupling the first IC 110 to the second IC 130.

The first IC 110 includes a set of transmitters Tx1 to TxN, and a set of differential Tcoils T1+/T1− to TN+/TN− coupled to differential outputs+/− of the set of transmitters Tx1 to TxN, respectively. The first IC 110 further includes a set of differential electrostatic discharge (ESD) circuits, such as ESD T1+/ESD T1− to ESD TN+/ESD TN−, coupled to the set of differential Tcoils T1+/T1− to TN+/TN−, respectively. The set of differential Tcoils T1+/T1− to TN+/TN− are coupled to the set of differential transmission lines 122-1+/122-1− to 122-N+/122-N− via a set of differential IC bumps (e.g., solder balls) 112-1+/112-1− to 112-N+/112-N−, respectively.

The second IC 130 includes a set of receivers Rx1 to RxN, and a set of differential Tcoils R1+/R1− to RN+/RN− coupled to differential inputs+/− of the set of receivers Rx1 to RxN, respectively. The second IC 130 further includes a set of ESD circuits, such as ESD R1+/R1− to ESD RN+/RN−, coupled to the set of differential Tcoils R1+/R1− to RN+/RN−, respectively. The set of differential Tcoils R1+/R1− to RN+/RN− are coupled to the set of differential transmission lines 122-1+/122-1− to 122-N+/122-N− via a set of differential IC bumps (e.g., solder balls) 132-1+/132-1− to 132-N+/132-N−, respectively.

In operation, the set of transmitters Tx1 to TxN of the first IC 110 may generate a set of N−1 data signals and an associated clock signal, which are transmitted to the second IC 130 via the set of differential Tcoils T1+/T1− to TN+/TN−, the set of differential IC bumps 112-1+/112-1− to 112-N+/112-N−, and the set of differential transmission lines 122-1+/122-1− to 122-N+/122-N−, respectively. The set of receivers Rx1 to RxN of IC 130 may receive the set of N−1 data signals and associated clock signal via the set of differential IC bumps 132-1+/132-1− to 132-N+/132-N− and the set of differential Tcoils R1+/R1− to RN+/RN−, respectively.

The set of ESD circuits ESD T1+/T1− to ESD TN+/TN− protect the transmitters Tx1 to TxN from electrostatic discharge that may come from the set of differential transmission lines 122-1+/122-1− to 122-N+/122-N−, respectively. Similarly, the set of ESD circuits ESD R1+/R1− to ESD RN+/RN− protect the receivers Rx1 to RxN from electrostatic discharge that may come from the set of differential transmission lines 122-1+/122-1− to 122-N+/122-N−, respectively.

Although the data communication system 100 has been described as being unidirectional; that is, the set of N−1 data signals and associated clock signal are transmitted from the first IC 110 to the second IC 130, it shall be understood that the data communication system 100 may be implemented for bidirectional data signal and clock transmission. In such case, the set of transmitters Tx1 to TxN and the set of receivers Rx1 and RxN may be implemented as a set of transceivers, respectively. Further, although the data communication system 100 has been described as communicating data and clock signals via a set of differential transmission lines 122-1+/122-1− to 122-N+/122-N−, it shall be understood that the data communication system 100 may employ single-ended transmission lines or pseudo-differential transmission lines for such data and clock signals transmissions.

Figure 2:
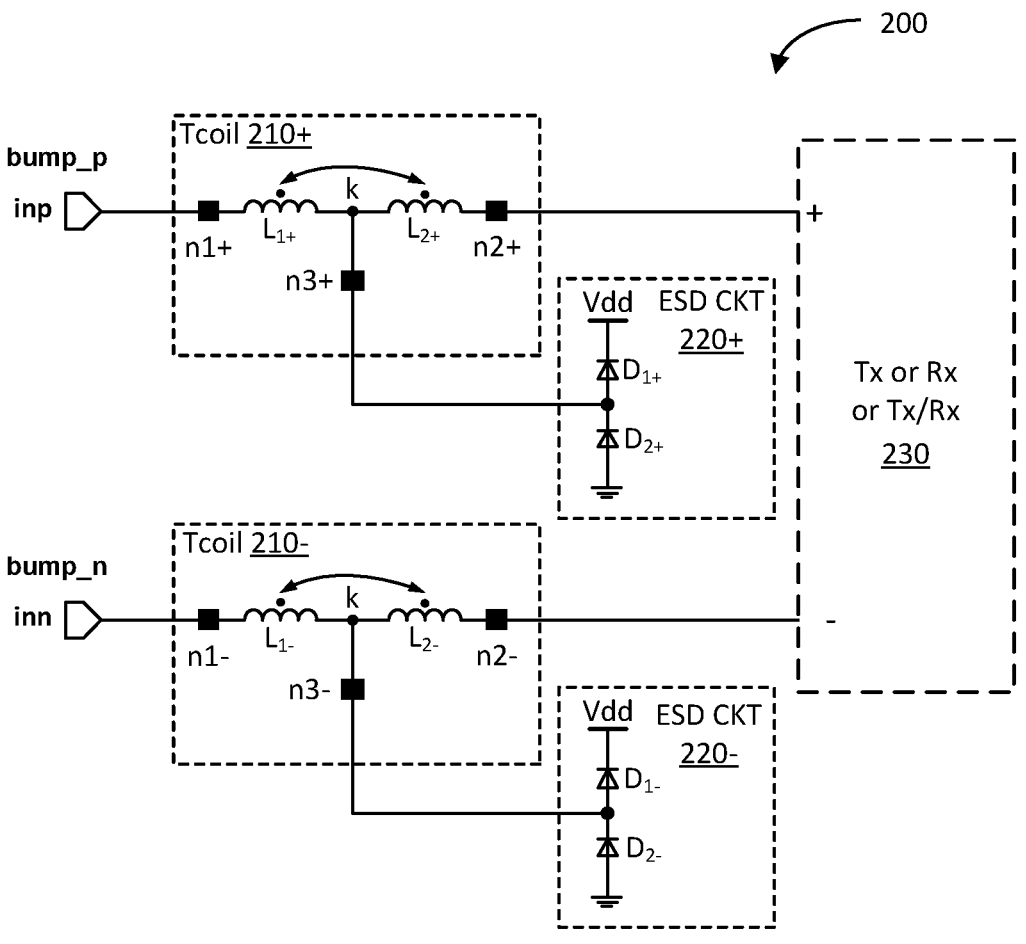
FIG. 2 illustrates a block/schematic diagram of an example integrated circuit (IC) interface circuit in accordance with another aspect of the disclosure.

FIG. 2 illustrates a block/schematic diagram of an example integrated circuit (IC) interface circuit 200 in accordance with another aspect of the disclosure. The IC interface circuit 200 may be a more detailed example implementation of the circuitry that interfaces the first IC 110 or the second IC 130 to one of the differential transmission lines 122-1+/122-1− to 122-N+/122-N− of data communication system 100.

The IC interface circuit 200 includes differential IC bumps (e.g., solder balls) bump_p/bump_n (e.g., to receive an input differential signal inp/inn via a differential transmission line), differential Tcoils 210+/210−, differential electrostatic discharge (ESD) circuits 220+/220-1, and a transmitter (Tx), receiver (Rx), or transceiver (Tx/Rx) 230 (which for brevity's sake is referred to herein as transceiver (Tx/Rx) 230).

The positive differential Tcoil 210+, in turn, includes a first inductor $L_{1+}$ and a second inductor $L_{2+}$, magnetically coupled together by mutual inductance factor "k". The first inductor $L_{1+}$, and the second inductor $L_{2+}$ are coupled in series between a first node n1+ and a second node n2+. The first node n1+ is coupled to the positive differential IC bump_p, and the second node n2+ is coupled to a positive differential port (+) of the transceiver (Tx/Rx) 230. A third node n3+, between the first and second inductors $L_{1+}$ and $L_{2+}$, is coupled to the positive differential ESD circuit 220+. The positive differential ESD circuit 220+ includes a first reverse bias diode $D_{1+}$ and a second reverse bias diode $D_{2+}$ coupled in series between an upper voltage rail Vdd and a lower voltage rail (e.g., ground). The node between the first and second diodes $D_{1+}$ and $D_{2+}$ coincides with or is coupled to the third node n3+ of the positive differential Tcoil 210+.

The negative differential Tcoil 210−, in turn, includes a first inductor $L_{1−}$ and a second inductor $L_{2−}$, magnetically coupled together by substantially the same mutual inductance factor "k". The first inductor $L_{1−}$ and the second inductor $L_{2−}$ are coupled in series between a first node n1− and a second node n2−. The first node n1− is coupled to the negative differential IC bump_n, and the second node n2− is coupled to a negative differential port (−) of the transceiver (Tx/Rx) 230. A third node n3−, between the first and second inductors $L_{1−}$ and $L_{2−}$, is coupled to the negative differential ESD circuit 220−. The negative differential ESD circuit 220− includes a first reverse bias diode $D_{1−}$ and a second reverse bias diode $D_{2−}$ coupled in series between the upper voltage rail Vdd and the lower voltage rail. The node between the first and second diodes $D_{1−}$ and $D_{2−}$ coincides with or is coupled to the third node n3− of the negative differential Tcoil 210−.

The differential Tcoils 210+/210− compensate for the capacitance of the diodes $D_{1+}/D_{2+}$ and $D_{1−}/D_{2−}$ of the differential ESD circuits 220+/220−, respectively. The differential Tcoils 210+/210− also compensate for parasitic capacitance associated with the differential ports (+/−) of the transceiver (Tx/Rx) 230. The compensation provided by the differential Tcoils 210+/210− improves the transmission of the data/clock signals such that higher data rates (bandwidth) and/or improved signal integrity may be achieved.

Figure 3:
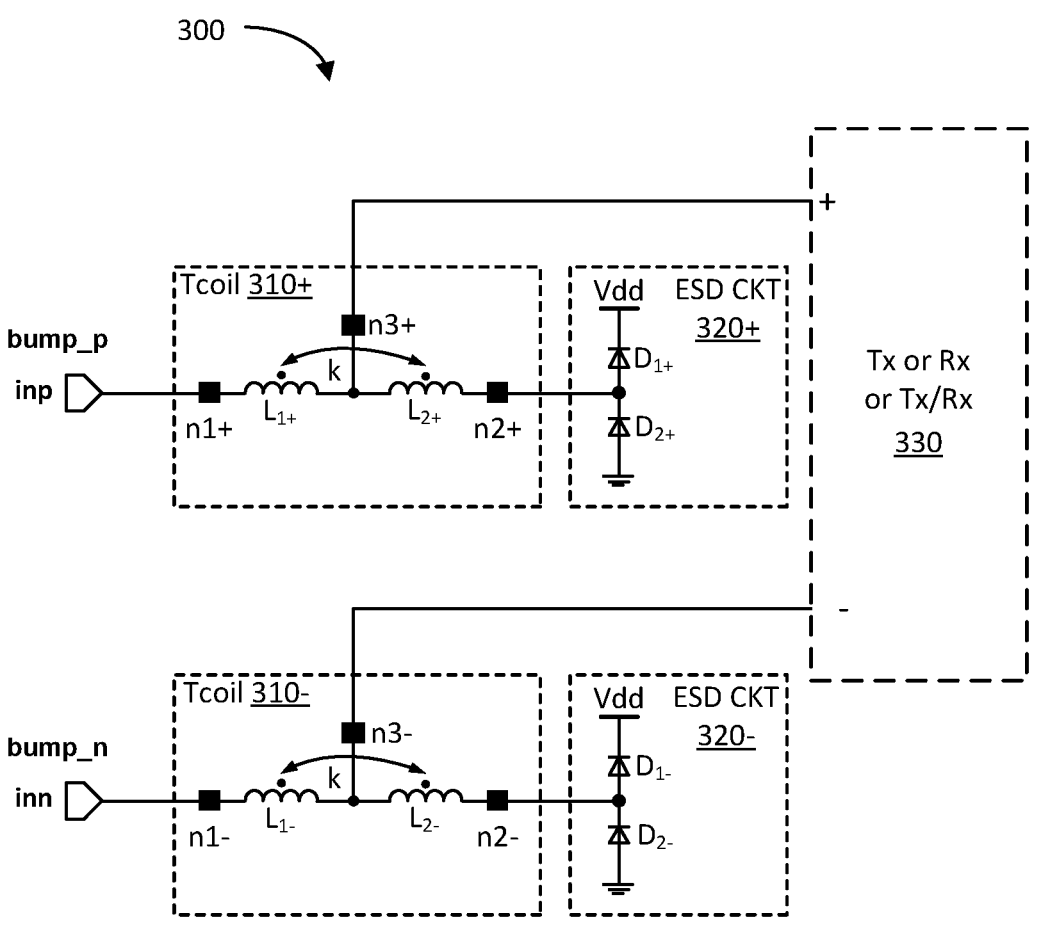
FIG. 3 illustrates a block/schematic diagram of another example integrated circuit (IC) interface circuit in accordance with another aspect of the disclosure.

FIG. 3 illustrates a block/schematic diagram of another example integrated circuit (IC) interface circuit 300 in accordance with another aspect of the disclosure. The IC interface circuit 300 may be a more detailed example implementation of the circuitry that interfaces the first IC 110 or the second IC 130 to one of the differential transmission lines 122-1+/122-1− to 122-N+/122-N− of data communication system 100. The IC interface circuit 300 is a variation of IC interface circuit 200 previously discussed.

In particular, the IC interface circuit 300 includes differential IC bumps (e.g., solder balls) bump_p/bump_n (e.g., to receive an input differential signal inp/inn via a differential transmission line), differential Tcoils 310+/310-1, differential electrostatic discharge (ESD) circuits 320+/320-, and a transmitter (Tx), receiver (Rx), or transceiver (Tx/Rx) 330 (which for brevity's sake is referred to herein as transceiver (Tx/Rx) 330).

The positive differential Tcoil 310+, in turn, includes a first inductor $L_{1+}$ and a second inductor $L_{2+}$, magnetically coupled together by mutual inductance factor "k". The first inductor $L_{1+}$ and the second inductor $L_{2+}$ are coupled in series between a first node n1+ and a second node n2+. The first node n1+ is coupled to the positive differential IC bump_p, and the second node n2+ is coupled to the positive differential ESD circuit 320+. A third node n3+, between the first and second inductors $L_{1+}$ and $L_{2+}$, is coupled to a positive differential port (+) of the transceiver (Tx/Rx) 330. The positive differential ESD circuit 320+ includes a first reverse bias diode $D_{1+}$ and a second reverse bias diode $D_{2+}$ coupled in series between an upper voltage rail Vdd and a lower voltage rail (e.g., ground). The node between the first and second diodes $D_{1+}$ and $D_{2+}$ coincides with or is coupled to the second node n2+ of the positive differential Tcoil 310+.

The negative differential Tcoil 310-, in turn, includes a first inductor $L_{1-}$ and a second inductor $L_{2-}$, magnetically coupled together by substantially the same mutual inductance factor "k". The first inductor $L_{1-}$ and the second inductor $L_{2-}$ are coupled in series between a first node n1- and a second node n2-. The first node n1- is coupled to the negative differential IC bump_p, and the second node n2- is coupled to the negative differential ESD circuit 320-. A third node n3-, between the first and second inductors $L_{1-}$ and $L_{2-}$, is coupled to a negative differential port (-) of the transceiver (Tx/Rx) 330. The negative differential ESD circuit 320- includes a first reverse bias diode $D_{1-}$ and a second reverse bias diode $D_{2-}$ coupled in series between the upper voltage rail Vdd and the lower voltage rail. The node between the first and second diodes $D_{1-}$ and $D_{2-}$ coincides with or is coupled to the second node n2- of the negative differential Tcoil 310-.

Similar to the Tcoils 210+/210- of IC interface circuit 200, the differential Tcoils 310+/310- compensate for the capacitance of the diodes $D_{1+}/D_{2+}$ and $D_{1-}/D_{2-}$ of the differential ESD circuits 320+/320-, respectively. The differential Tcoils 310+/310- also compensate for parasitic capacitance associated with the differential ports (+/-) of the transceiver (Tx/Rx) 330. The compensation provided by the differential Tcoils 310+/310- improves the transmission of the data/clock signals such that higher data rates (bandwidth) and improved signal integrity may be achieved.

Figure 4:
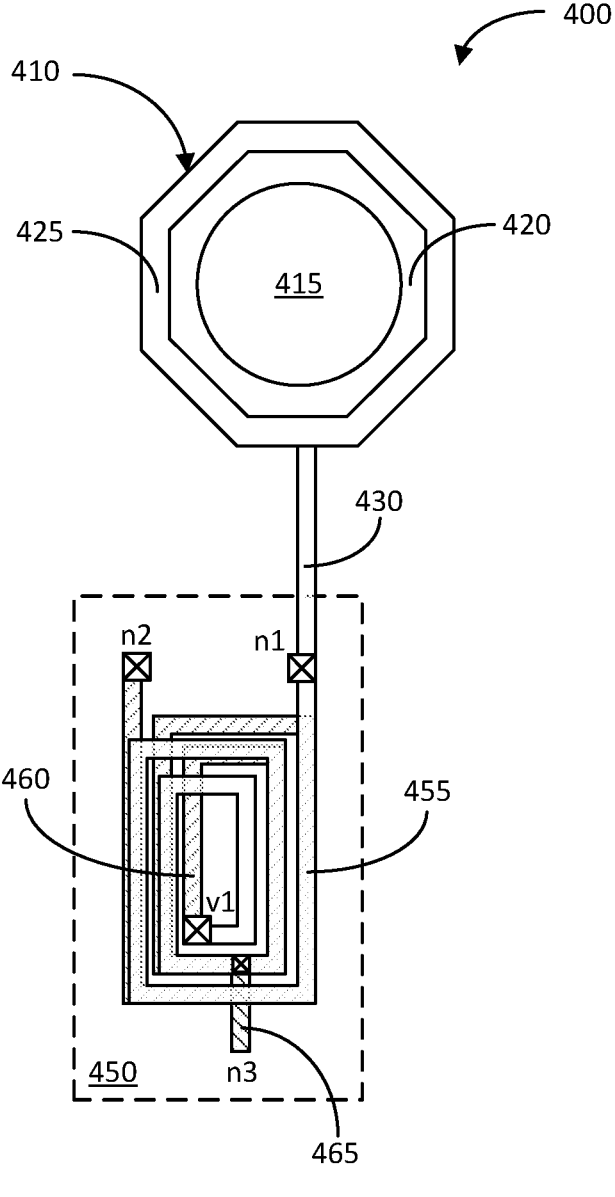
FIG. 4 illustrates a layout view of an example bump and Tcoil of an integrated circuit (IC) interface circuit in accordance with another aspect of the disclosure.

FIG. 4 illustrates a layout view of an example bump (e.g., solder ball) 410 and Tcoil 450 of an integrated circuit (IC) interface circuit 400 in accordance with another aspect of the disclosure. The IC bump 410 includes an under bump metallization (UBM) 415, a dielectric or passivation layer 420 concentrically situated around the UBM 415, and a lower metallization layer 425 concentrically situated below and electrically coupled to the UBM 415. The metallization layer 425 may be an aluminum-for-bond-pad (AP) layer, which is often the top metal layer of the IC. The IC interface circuit 400 further includes a metal interconnect 430 electrically coupling the UBM 415 and AP layer 425 to the Tcoil 450.

The metal interconnect 430 couples to node n1 of the Tcoil 450. The Tcoil 450 includes a first inductor winding

455 extending from the node n1 to a metallized via hole v1 on a particular metal layer (e.g., a metal layer immediately below the AP layer 425, such as metal layer M14). The Tcoil 450 further includes a second inductor winding 460 extending from the metallized via hole v1 to a node n2 on another particular metal layer (e.g., a metal layer immediately below the metal layer upon which the first inductor winding 455 is formed, such as metal layer M13). The first and second inductor windings 455 and 460 may be wound in the same direction (e.g., clockwise in this example) so that they are mutually coupled. A lead-out interconnect 465 to node n3 may be electrically attached to either the first or second inductor winding 455 or 460. As previously discussed, a transceiver, transmitter or receiver may be coupled to either node n2 or n3, and an ESD circuit may be coupled to node n3 or n2, respectively.

Note that, in IC interface circuit 400, the IC bump 410 is separate from the Tcoil 450. For example, the IC bump 410 is laterally displaced from the Tcoil 450 as shown in FIG. 4. The separateness of the IC bump 410 and the Tcoil 450 requires substantial IC footprint to implement. This IC footprint is more significant when there are many bump/Tcoil pairings, such as the case in the data communication system 100 having many (N) parallel data lanes. For example, if N in data communication system 100 is 16, then there may be 64 bump/Tcoil pairings, which is substantial with regard to IC footprint.

Moreover, the IC bump 410 is coupled to the Tcoil 450 via the metal interconnect 430. Such metal interconnect 430 generally introduces unwanted parasitic, which degrades bandwidth and data transmission/reception performance. Further, due to dense IC cell placement, it may be difficult to situate IC bump-Tcoil pairings substantially the same for each differential line and data lane, which may have the adverse consequence of producing signal mismatch between differential lines of the same or different data lanes.

Figure 5A:
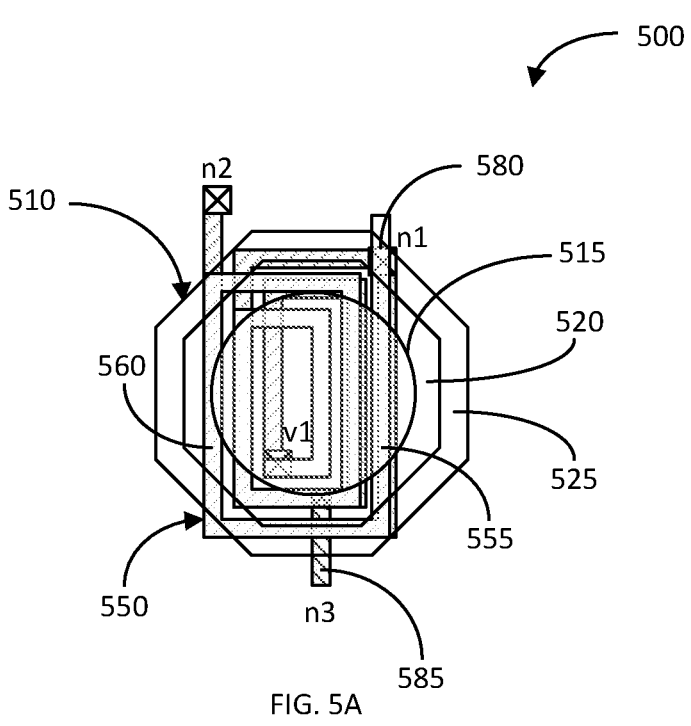
FIGS. 5A-5B illustrate layout and cross-sectional views of an example integrated circuit (IC) interface circuit including an integrated bump/Tcoil in accordance with another aspect of the disclosure.
Figure 5B:
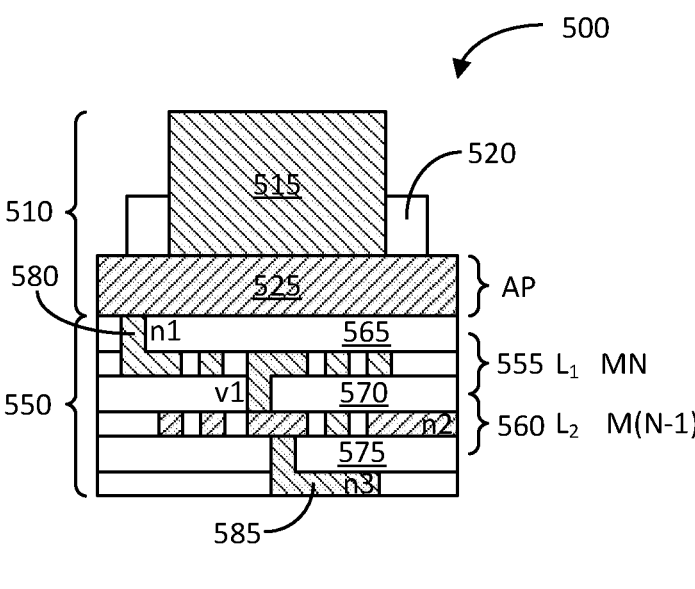

FIGS. 5A-5B illustrate layout and cross-sectional views of an example integrated circuit (IC) interface circuit 500 including an integrated bump and Tcoil in accordance with another aspect of the disclosure. In particular, the IC interface circuit 500 includes an IC bump (e.g., solder ball) 510 and a Tcoil 550 situated directly below the IC bump 510. Additionally, as discussed in more detail herein, the IC bump 510 is electrically coupled to the Tcoil 550 by way of a metallized via hole.

The feature of having the Tcoil 550 situated directly below the IC bump 510 in an IC utilizes the IC area or footprint in an efficient manner compared to the separate IC bump 410 and Tcoil 450 of IC interface circuit 400. The feature of having the IC bump 510 electrically coupled to the Tcoil 550 by way of a metallized via hole (which is significantly shorter than the metal interconnect 430 of IC interface circuit 400) reduces parasitic, and allows for improved signal transmission performance. Moreover, since the integrated IC bump 510 and Tcoil 550 has less impact on IC footprint, the IC interface circuit 500 may be replicated for multiple data lanes with reduced variation so that signal matching between differential signal transmissions for a data lane, or signal transmission among a set of data lanes are well matched.

With regard to the details of the IC interface circuit 500, the IC bump 510 includes an under bump metallization (UBM) 515, a dielectric or passivation layer 520 concentrically situated around the UBM 515, and a lower metallization layer 525 concentrically situated below and electrically coupled to the UBM 515. The metallization layer 525 may be the aluminum-for-bond-pad (AP) layer, which is often the top metal layer of the IC. The IC interface circuit 500 further includes a metallized via hole 580 situated directly below and electrically coupled to the AP layer 525. Accordingly, the UBM 515 is electrically coupled to the Tcoil 550 via the AP layer 525 and the metallized via hole 580.

The metallized via hole 580 may be the input node n1 of the Tcoil 550. The Tcoil 550 includes a first inductor winding 555 extending from the node n1 (metallized via hole 580) to another metallized via hole v1 on a particular metal layer (e.g., a metal layer immediately below the AP layer 525, such as metal layer MN, where N is an integer (e.g., metal layer M14)). The first inductor winding 555 forms the first inductor $L_1$ of the Tcoil 550. The first inductor winding 555 is situated directly below the UBM 515 and the AP layer 525. A first dielectric layer 565, through which the metallized via hole 580 extends, separates the first inductor winding 555 from the AP layer 525.

The Tcoil 550 further includes a second inductor winding 560 extending from the metallized via hole v1 to a node n2 on another particular metal layer (e.g., a metal layer immediately below the metal layer upon which the first inductor winding 555 is formed, such as metal layer M(N−1) (e.g., metal layer M13)). The second inductor winding 560 forms the second inductor $L_2$ of the Tcoil 550. A second dielectric layer 570, through which the metallized via hole v1 extends, separates the second inductor winding 560 from the first inductor winding 555.

The first and second inductor windings 555 and 560 may be wound in the same direction (e.g., clockwise as seen from above, in this example) so that they are mutually coupled. A lead-out interconnect 585 to form node n3 may be electrically coupled to either the first or second inductor winding 555 or 560; but in this example, the lead-out interconnect 585 is situated on another metal layer (e.g., metal layer M(N−2) (e.g., metal layer M12), and is electrically coupled to the second inductor winding 560 by way of a third metalized via hole through a third dielectric layer 575.

As previously discussed, a transceiver, transmitter or receiver may be coupled to either node n2 or n3, and the ESD circuit may be coupled to node n3 or n2, respectively. Although in this example, the Tcoil 550 includes two inductor windings 555 and 560 formed on different metal layers MN and M(N−1), it shall be understood that the Tcoil 550 may include more than two inductor windings formed on more than two metal layers, respectively. Alternatively, as discussed in more detail below, the Tcoil 550 may be formed on as a single inductor winding on a single metal layer, wherein a first portion or half of the inductor winding serves as the first inductor $L_1$, a second portion or half of the inductor winding serves as the second inductor $L_2$, and the node between the two inductor portions serves as node n3 for electrical connection to an ESD circuit or a transceiver, transmitter or receiver.

Figure 6A:
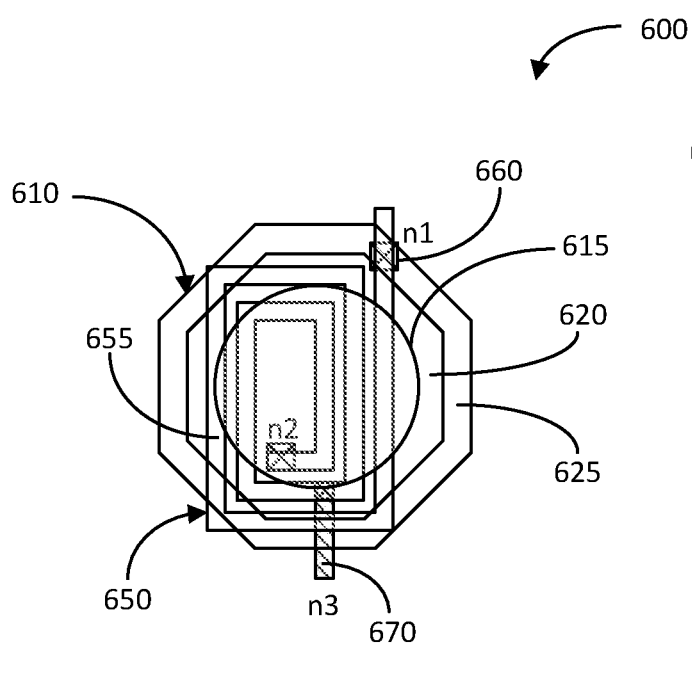
FIGS. 6A-6B illustrate layout and cross-sectional views of another example integrated circuit (IC) interface circuit including an integrated bump/Tcoil in accordance with another aspect of the disclosure.
Figure 6B:
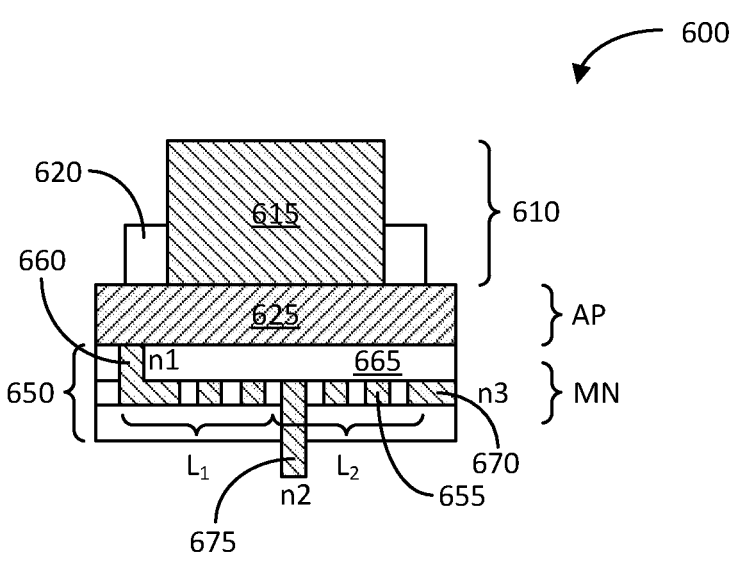

FIGS. 6A-6B illustrate layout and cross-sectional views of an example integrated circuit (IC) interface circuit 600 including an integrated bump and Tcoil in accordance with another aspect of the disclosure. The IC interface circuit 600 is a variation of the IC interface circuit 500, where the inductors $L_1$ and $L_2$ of the Tcoil are formed as a single inductor winding on a single metal layer. In particular, the IC interface circuit 600 includes an IC bump (e.g., solder ball) 610 and a Tcoil 650 situated directly below the IC bump 610. Additionally, as discussed in more detail herein, the IC bump 610 is electrically coupled to the Tcoil 650 by way of a metallized via hole 660.

More specifically, the IC bump 610 includes an under bump metallization (UBM) 615, a dielectric or passivation layer 620 concentrically situated around the UBM 615, and a lower metallization layer 625 concentrically situated below and electrically coupled to the UBM 615. The metallization layer 625 may be the aluminum-for-bond-pad (AP) layer, which is often the top metal layer of the IC. As discussed, the IC interface circuit 600 further includes the metallized via hole 660 situated directly below and electrically coupled to the AP layer 625 and the Tcoil 650. Accordingly, the UBM 615 is electrically coupled to the Tcoil 650 via the AP layer 625 and the metallized via hole 660.

The metallized via hole 660 may be the input node n1 of the Tcoil 650. The Tcoil 650 includes an inductor winding 655 extending from the node n1 to node n2 on a particular metal layer (e.g., a metal layer immediately below the AP layer 625, such as metal layer MN, wherein N is an integer (e.g., metal layer M14)). A first lead-out interconnect 670 to node n3 may be electrically coupled to a central region of the inductor winding 655. The inductor winding 655 is situated directly below the UBM 615 and the AP layer 625. A dielectric layer 665, through which the metallized via hole 660 extends, separates the inductor winding 655 from the AP layer 625.

A first portion of the inductor winding 655 extending from node n1 to node n3 may form the first inductor $L_1$ of the Tcoil 650. A second portion of the inductor winding 655 extending from node n3 to node n2 may form the second inductor $L_2$ of the Tcoil 650. The Tcoil 650 may include a second lead-out interconnect 675 by way of a metallized via hole and different metal layer to couple node n2 to another circuit. For example, as previously discussed, a transceiver, transmitter or receiver may be coupled to either node n2 or n3, and the ESD circuit may be coupled to node n3 or n2, respectively.

Figure 7A:
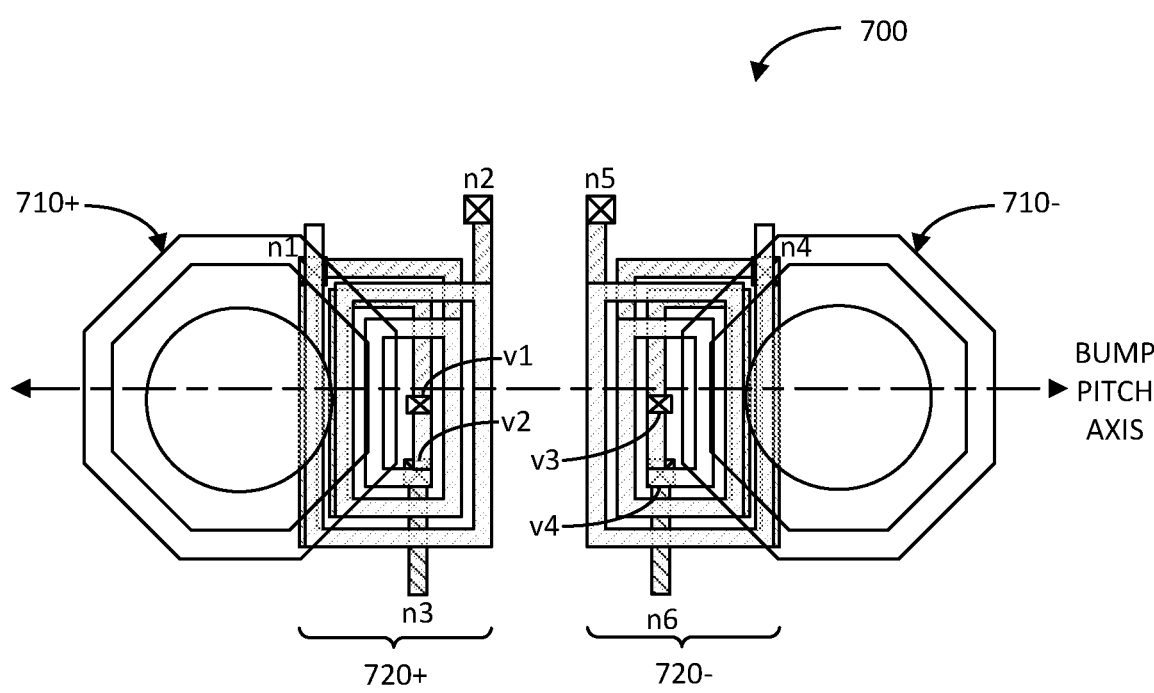
FIGS. 7A-7B illustrate layout and cross-sectional views of another example integrated circuit (IC) interface circuit including an example integrated differential bumps/Tcoils in accordance with another aspect of the disclosure.
Figure 7B:
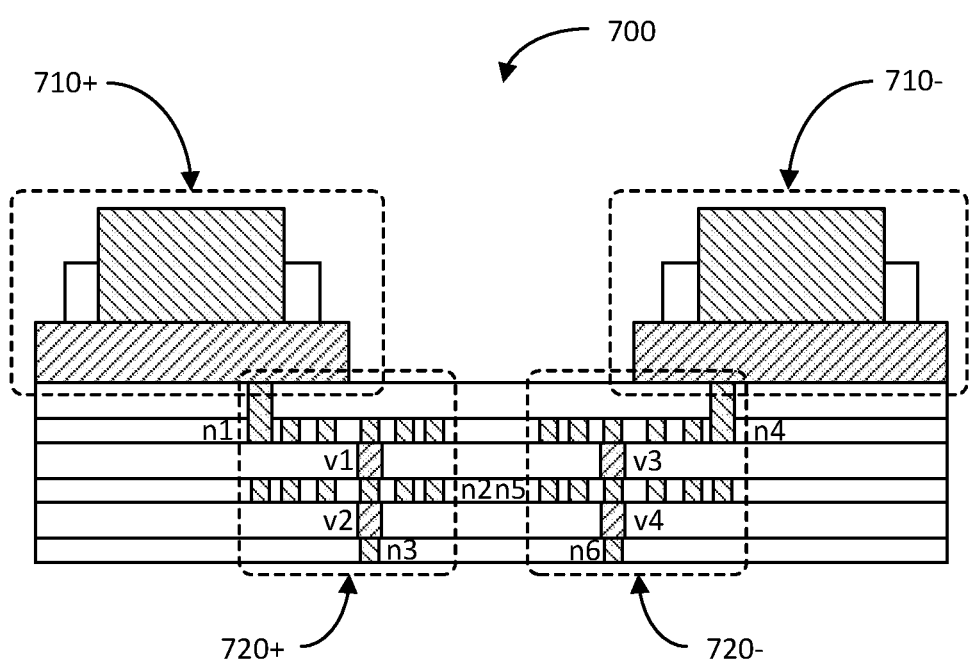

FIGS. 7A-7B illustrate layout and cross-sectional views of another example integrated circuit (IC) interface circuit 700 including an example integrated differential bumps 710+/710− and Tcoils 720+/720− in accordance with another aspect of the disclosure. The differential bumps 710+/710− may each be implemented per bump 510 or 610 previously discussed. Similarly, the differential Tcoils 720+/720− may each be implemented per Tcoil 550 or 650 previously discussed. The integrated bump/Tcoil 710+/720+ may process a positive component of a differential signal, and the integrated bump/Tcoil 710−/720− may process a negative component of the differential signal.

In the example IC interface circuit 700, the differential bumps 710+/710− lie, center-to-center, along a bump pitch axis, and the differential Tcoils 720+/710− also lie along the bump pitch axis. Or said differently, the differential Tcoils 720+/710− lie along a Tcoil pitch axis which is coaxial with the bump pitch axis. Further, the Tcoils 720+ and 720− are partially underneath the bumps 710+ and 710−, respectively. Additionally, the distance between the bumps 710+ and 710− is greater than the distance between the Tcoils 720+ and 720− along the bump/Tcoil pitch axis.

Figure 8A:
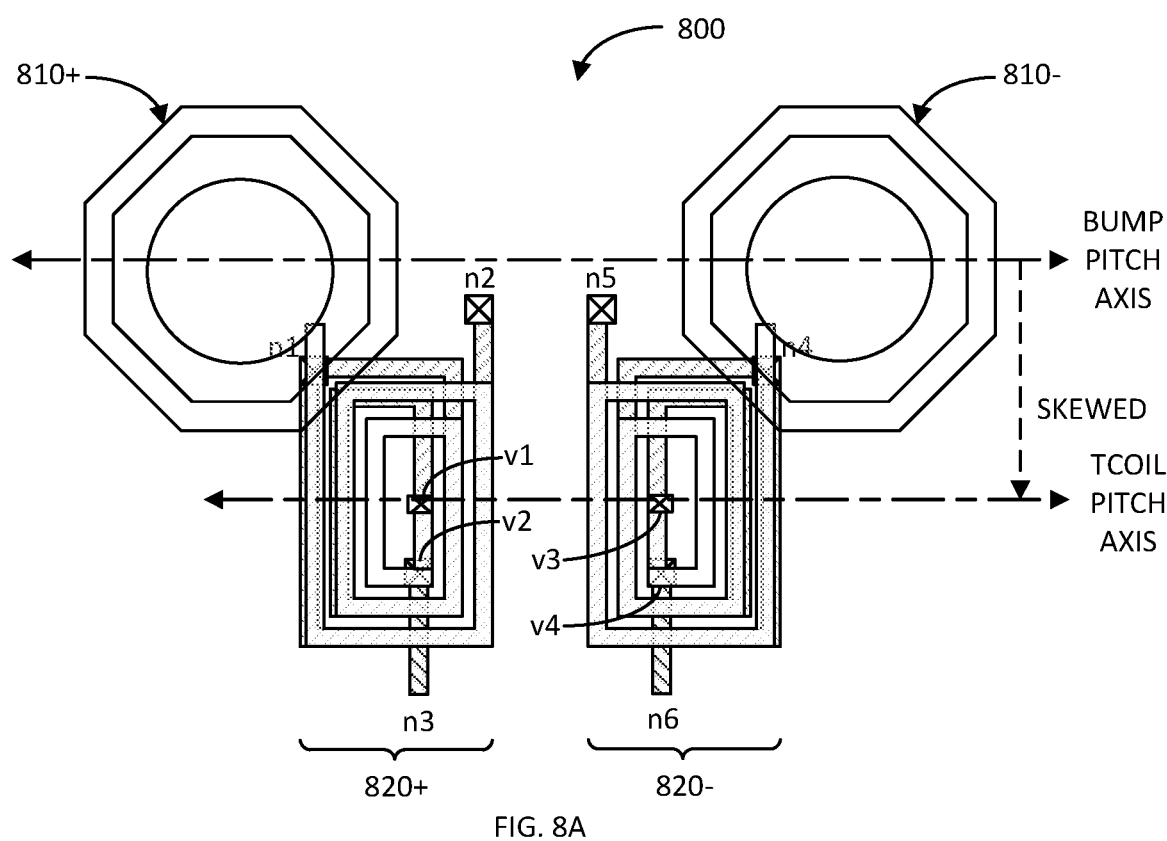
FIGS. 8A-8B illustrate layout and cross-sectional views of another example integrated circuit (IC) interface circuit including another example integrated differential bumps/Tcoils in accordance with another aspect of the disclosure.
Figure 8B:
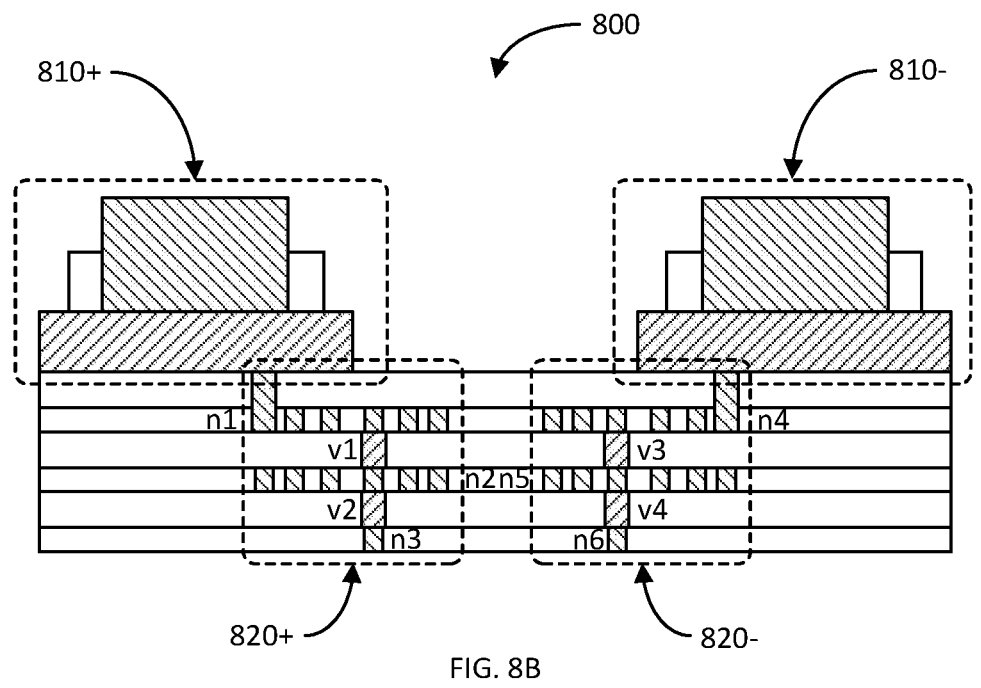

FIGS. 8A-8B illustrate layout and cross-sectional views of another example integrated circuit (IC) interface circuit 800 including another example integrated differential bumps 810+/810− and Tcoils 820+/820− in accordance with another aspect of the disclosure. The differential bumps 810+/810− may each be implemented per bump 510 or 610 previously discussed. Similarly, the differential Tcoils 820+/820− may each be implemented per Tcoil 550 or 650 previously discussed. The integrated bump/Tcoil 810+/820+ may process a positive component of a differential signal, and the integrated bump/Tcoil 810–/820– may process a negative component of the differential signal.

In the example IC interface circuit 800, the differential bumps 810+/810– lie, center-to-center, along a bump pitch axis. The differential Tcoils 820+/810– lie along Tcoil pitch axis that is skewed or spaced apart from the bump pitch axis. Similarly, the Tcoils 820+ and 820– are partially underneath the bumps 810+ and 810–, respectively. Also similarly, the distance between the bumps 810+ and 810– along the bump pitch axis is greater than the distance between the Tcoils 820+ and 820– along the Tcoil pitch axis.

Figure 9:
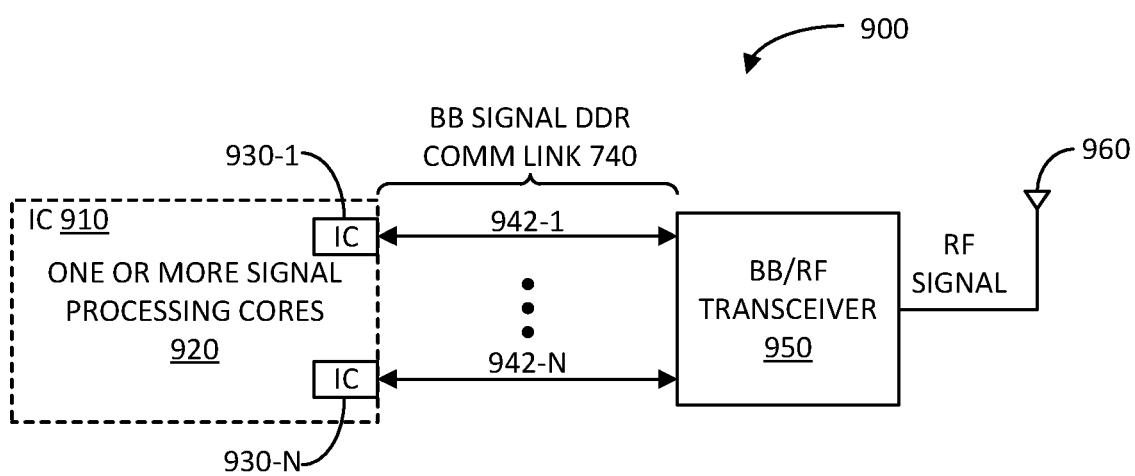
FIG. 9 illustrates a block diagram of an example wireless communication device in accordance with another aspect of the disclosure.

FIG. 9 illustrates a block diagram of an example wireless communication device 900 in accordance with another aspect of the disclosure. The wireless communication device 900 may be a smart phone, a desktop computer, laptop computer, tablet device, Internet of Things (IoT), wearable wireless device (e.g., wireless watch), and other types of wireless device.

In particular, the wireless communication device 900 includes an integrated circuit (IC) 910, which may be implemented as a system on chip (SOC). The IC 910 includes one or more signal processing cores 920 configured to generate a transmit baseband (BB) signal and process a received baseband (BB) signal. The IC 910 additionally includes a set of interface circuits (ICs) 930-1 to 930-N coupled to a set of transmission lines 942-1 to 940-N of a baseband signal double data rate (DDR) communication link 940 coupling the IC 910 to a baseband/radio frequency (BB/RF) transceiver 950. The set of interface circuits (IC) 930-1 to 930-N may be implemented per IC interface circuits 200, 300, 500, 600, 700, and 800 previously discussed.

The transceiver 950 is coupled to the one or more signal processing cores 920 to receive therefrom the transmit BB signal and provide thereto the received BB signal via the BB signal DDR communication link 940. The transceiver 950 is configured to convert the transmit BB signal into a transmit radio frequency (RF) signal, and convert a received RF signal into the received BB signal. The transceiver 950 is coupled to the at least one antenna 960 to provide thereto the transmit RF signal for electromagnetic radiation into a wireless medium for wireless transmission, and receive the received RF signal electromagnetically picked up from the wireless medium by the at least one antenna 960.

The following provides an overview of aspects of the present disclosure:

Aspect 1: An integrated circuit (IC), comprising: an IC bump; and a Tcoil situated directly below the IC bump, wherein the Tcoil is electrically coupled to the IC bump by way of a first metallized via hole.

Aspect 2: The IC of aspect 1, wherein the Tcoil includes a first inductor winding situated on a first metal layer.

Aspect 3: The IC of aspect 2, wherein the first inductor winding extends from a first node proximate the first metallized via hole to a second node, wherein the Tcoil further comprises a lead-out interconnect coupled to the first inductor winding at a third node between the first and second nodes.

Aspect 4: The IC of aspect 3, further comprising a transceiver, transmitter or receiver coupled to the second node.

Aspect 5: The IC of aspect 4, further comprising an electrostatic discharge (ESD) circuit coupled to the third node.

Aspect 6: The IC of aspect 5, wherein the ESD circuit comprises: a first diode; and a second diode coupled in series with the first diode between a first voltage rail and a second voltage rail, wherein a fourth node between the first and second diodes coincides with or is coupled to the third node.

Aspect 7: The IC of aspect 6, wherein the first and second diodes are reverse biased.

Aspect 8: The IC of aspect 3, further comprising a transceiver, transmitter or receiver coupled to the third node.

Aspect 9: The IC of aspect 9, further comprising an electrostatic discharge (ESD) circuit coupled to the second node.

Aspect 10: The IC of any one of aspects 1-9, wherein the IC bump comprises an under bump metallization (UBM) electrically coupled to the Tcoil by way of the first metallized via.

Aspect 11: The IC of aspect 10, wherein the UBM is situated over and electrically coupled to an aluminum-for-bond-pad (AP) layer.

Aspect 12: The IC of aspect 11, further comprising a dielectric layer situated between the AP layer and the Tcoil, wherein the first metallized via hole extends through the dielectric layer.

Aspect 13: The IC of any one of aspects 1-12, wherein the Tcoil comprises: a first inductor winding situated on a first metal layer; and a second inductor winding situated on a second metal layer.

Aspect 14: The IC of aspect 13, wherein the first inductor winding extends from the first metallized via hole to a second metallized via hole.

Aspect 15: The IC of aspect 14, wherein the second inductor winding is electrically coupled to the first inductor winding by way of the second metallized via hole.

Aspect 16: The IC of aspect 15, further comprising a first dielectric layer situated between the IC bump and the first inductor winding, wherein the first metallized via hole extends through the first dielectric layer.

Aspect 17: The IC of aspect 16, further comprising a second dielectric layer situated between the first inductor winding and the second inductor winding, wherein the second metallized via hole extends through the second dielectric layer.

Aspect 18: The IC of any one of aspects 15-17, wherein the second inductor winding extends from the second metallized via hole to a first node.

Aspect 19: The IC of aspect 18, further comprising a transceiver, transmitter or receiver coupled to the first node.

Aspect 20: The IC of aspect 18, further comprising an electrostatic discharge (ESD) circuit coupled to the first node.

Aspect 21: The IC of aspect 18, further comprising a lead-out interconnect coupled between the first or second inductor winding and a second node.

Aspect 22: The IC of aspect 21, further comprising a transceiver, transmitter or receiver coupled to the second node.

Aspect 23: The IC of aspect 21, further comprising an electrostatic discharge (ESD) circuit coupled to the second node.

Aspect 24: The IC of aspect 1, wherein the IC bump is electrically coupled to a transmission line on a printed circuit board (PCB).

Aspect 25: The IC of claim 24, wherein the transmission line comprises a differential transmission line.

Aspect 26: A data communication system, comprising: a printed circuit board (PCB) comprising a set of transmission lines; and a first integrated circuit (IC) mounted on the PCB, wherein the first IC includes a first set of IC interface circuits, comprising: a first set of IC bumps electrically coupled to the set of transmission lines, respectively; and a first set of Tcoils, each Tcoil of the first set of Tcoils situated directly below a respective IC bump of the first set of IC bumps, wherein the first set of Tcoils are electrically coupled to the first set of IC bump by way of a first set of metallized via holes, respectively.

Aspect 27: The data communication system of aspect 26, further comprising: a second IC mounted on the PCB, wherein the second IC includes a second set of IC interface circuits, comprising: a second set of IC bumps electrically coupled to the set of transmission lines, respectively; and a second set of Tcoils, each Tcoil of the second set of Tcoils situated directly below a respective IC bump of the second set of IC bumps, wherein the second set of Tcoils are electrically coupled to the second set of IC bumps by way of a second set of metallized via holes, respectively.

Aspect 28: The data communication system of aspect 27, wherein: the first IC comprises: a set of transmitters coupled to the first set of Tcoils, respectively; and a first set of electrostatic discharge (ESD) circuits coupled to the first set of Tcoils, respectively; and the second IC comprises: a set of receivers coupled to the second set of Tcoils, respectively; and a second set of ESD circuits coupled to the second set of Tcoils, respectively.

Aspect 29: The data communication system of aspect 27, wherein: the first IC comprises: a first set of transceivers coupled to the first set of Tcoils, respectively; and a first set of electrostatic discharge (ESD) circuits coupled to the first set of Tcoils, respectively; and the second IC comprises: a second set of transceivers coupled to the second set of Tcoils, respectively; and a second set of ESD circuits coupled to the second set of Tcoils, respectively.

Aspect 30: A wireless communication device, comprising: at least one antenna; a transceiver coupled to the at least one antenna; and an integrated circuit (IC) including one or more signal processing cores, wherein the IC includes a set of IC interface circuits, comprising: a set of IC bumps electrically coupled to a set of transmission lines electrically coupling the IC to the transceiver, respectively; and a set of Tcoils, each Tcoil of the set of Tcoils situated directly below a respective IC bump of the set of IC bumps, wherein the set of Tcoils are electrically coupled to the set of IC bumps by way of a set of metallized via holes, respectively.

Aspect 31: An integrated circuit (IC), comprising: a set of differential IC bump; and a set of differential Tcoils situated at least partially directly below the set of differential IC bumps, wherein the set of differential Tcoils is electrically coupled to the set of differential IC bumps by way of a set of metallized via hole, respectively.

Aspect 32: The IC of aspect 31, wherein the set of differential IC bumps and the set of differential Tcoils lie substantially along a pitch axis.

Aspect 33: The IC of aspect 32, wherein a distance between the set of differential IC bumps is greater than a distance between the set of differential Tcoils.

Aspect 34: The IC of aspect 31, wherein the set of differential IC bumps lie along a first pitch axis, wherein the set of differential Tcoils lie along a second pitch axis, wherein the second pitch axis is skewed from the first pitch axis.

Aspect 35: The IC of aspect 34, wherein a distance between the set of differential IC bumps along the first pitch axis is greater than a distance between the set of differential Tcoils along the second pitch axis.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An integrated circuit (IC), comprising:
an IC bump;
a Tcoil situated directly below the IC bump, wherein the Tcoil is electrically coupled to the IC bump by way of a first metallized via hole, wherein the Tcoil includes a first inductor winding situated on a first metal layer, wherein the first inductor winding extends from a first node proximate the first metallized via hole and a second node, and wherein the Tcoil further includes a lead-out interconnect coupled to the first inductor winding at a third node between the first and second nodes; and
an electrostatic discharge (ESD) circuit coupled to the third node.

2. The IC of claim 1, further comprising a transceiver, transmitter or receiver coupled to the second node.

3. The IC of claim 1, wherein the ESD circuit comprises:
a first diode; and
a second diode coupled in series with the first diode between a first voltage rail and a second voltage rail, wherein a fourth node between the first and second diodes coincides with or is coupled to the third node.

4. The IC of claim 3, wherein the first and second diodes are reverse biased.

5. The IC of claim 1, further comprising a transceiver, transmitter or receiver coupled to the third node.

6. The IC of claim 5, further comprising an electrostatic discharge (ESD) circuit coupled to the second node.

7. The IC of claim 1, wherein the IC bump comprises an under bump metallization (UBM) electrically coupled to the Tcoil by way of the first metallized via hole.

8. The IC of claim 7, wherein the UBM is situated over and electrically coupled to an aluminum-for-bond-pad (AP) layer.

9. The IC of claim 8, further comprising a dielectric layer situated between the AP layer and the Tcoil, wherein the first metallized via hole extends through the dielectric layer.

10. The IC of claim 1, wherein the Tcoil further comprises:
a second inductor winding situated on a second metal layer.

11. The IC of claim 10, wherein the first inductor winding extends from the first metallized via hole to a second metallized via hole.

12. The IC of claim 11, wherein the second inductor winding is electrically coupled to the first inductor winding by way of the second metallized via hole.

13. The IC of claim 12, further comprising a first dielectric layer situated between the IC bump and the first inductor winding, wherein the first metallized via hole extends through the first dielectric layer.

14. The IC of claim 13, further comprising a second dielectric layer situated between the first inductor winding and the second inductor winding, wherein the second metallized via hole extends through the second dielectric layer.

15. The IC of claim 12, wherein the second inductor winding extends from the second metallized via hole to the second node.

16. The IC of claim 15, further comprising a transceiver, transmitter or receiver coupled to the second node.

17. The IC of claim 15, further comprising an electrostatic discharge (ESD) circuit coupled to the first node.

18. The IC of claim 15, further comprising a lead-out interconnect coupled between the second inductor winding and the third node.

19. The IC of claim 18, further comprising a transceiver, transmitter or receiver coupled to the third node.

20. The IC of claim 18, further comprising an electrostatic discharge (ESD) circuit coupled to the second node.

21. The IC of claim 1, wherein the IC bump is electrically coupled to a transmission line on a printed circuit board (PCB).

22. The IC of claim 21, wherein the transmission line comprises a differential transmission line.

23. A data communication system, comprising:
   a printed circuit board (PCB) comprising a set of transmission lines;
   a first integrated circuit (IC) mounted on the PCB, wherein the first IC includes a first set of IC interface circuits, comprising:
      a first set of IC bumps electrically coupled to the set of transmission lines, respectively; and
      a first set of Tcoils, each Tcoil of the first set of Tcoils situated directly below a respective IC bump of the first set of IC bumps, wherein the first set of Tcoils are electrically coupled to the first set of IC bumps by way of a first set of metallized via holes, respectively; and
   a second IC mounted on the PCB, wherein the second IC includes a second set of IC interface circuits, comprising:
      a second set of IC bumps electrically coupled to the set of transmission lines, respectively; and
      a second set of Tcoils, each Tcoil of the second set of Tcoils situated directly below a respective IC bump of the second set of IC bumps, wherein the second set of Tcoils are electrically coupled to the second set of IC bumps by way of a second set of metallized via holes, respectively.

24. The data communication system of claim 23, wherein:
   the first IC comprises:
      a set of transmitters coupled to the first set of Tcoils, respectively; and
      a first set of electrostatic discharge (ESD) circuits coupled to the first set of Tcoils, respectively; and
   the second IC comprises:
      a set of receivers coupled to the second set of Tcoils, respectively; and a second set of ESD circuits coupled to the second set of Tcoils, respectively.

25. The data communication system of claim 23, wherein:
   the first IC comprises:
      a first set of transceivers coupled to the first set of Tcoils, respectively; and
      a first set of electrostatic discharge (ESD) circuits coupled to the first set of Tcoils, respectively; and
   the second IC comprises:
      a second set of transceivers coupled to the second set of Tcoils, respectively; and
      a second set of ESD circuits coupled to the second set of Tcoils, respectively.

26. A wireless communication device, comprising:
   at least one antenna;
   a transceiver coupled to the at least one antenna; and
   an integrated circuit (IC) including one or more signal processing cores, wherein the IC includes a set of IC interface circuits, comprising:
      a set of IC bumps electrically coupled to a set of transmission lines electrically coupling the IC to the transceiver, respectively; and
      a set of Tcoils, each Tcoil of the set of Tcoils situated directly below a respective IC bump of the set of IC bumps, wherein the set of Tcoils is electrically coupled to the set of IC bumps by way of a set of metallized via holes, respectively;
   wherein the set of IC bumps lie along a first pitch axis, wherein the set of Tcoils lie along a second pitch axis, wherein the second pitch axis is skewed from the first pitch axis.

27. An integrated circuit (IC), comprising:
   a set of differential IC bumps; and
   a set of differential Tcoils situated at least partially directly below the set of differential IC bumps, wherein the set of differential Tcoils is electrically coupled to the set of differential IC bumps by way of a set of metallized via holes, respectively;
   wherein the set of differential IC bumps lie along a first pitch axis, wherein the set of differential Tcoils lie along a second pitch axis, wherein the second pitch axis is skewed from the first pitch axis.

28. The IC of claim 27, wherein a distance between the set of differential IC bumps along the first pitch axis is greater than a distance between the set of differential Tcoils along the second pitch axis.

\* \* \* \* \*